US011774283B2

(12) United States Patent
Baba et al.

(10) Patent No.: US 11,774,283 B2
(45) Date of Patent: Oct. 3, 2023

(54) PHOTODETECTOR DEVICE

(71) Applicant: HAMAMATSU PHOTONICS K.K., Hamamatsu (JP)

(72) Inventors: Takashi Baba, Hamamatsu (JP); Tatsuya Hashi, Hamamatsu (JP); Yoshihito Suzuki, Hamamatsu (JP); Kenji Makino, Hamamatsu (JP); Shigeyuki Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 467 days.

(21) Appl. No.: 16/963,303

(22) PCT Filed: Jan. 24, 2019

(86) PCT No.: PCT/JP2019/002350
§ 371 (c)(1),
(2) Date: Jul. 20, 2020

(87) PCT Pub. No.: WO2019/146723
PCT Pub. Date: Aug. 1, 2019

(65) Prior Publication Data
US 2021/0372852 A1    Dec. 2, 2021

(30) Foreign Application Priority Data
Jan. 26, 2018    (JP) .................................. 2018-011826

(51) Int. Cl.
*G01J 1/44*        (2006.01)
*G01S 7/4863*    (2020.01)
(Continued)

(52) U.S. Cl.
CPC .............. *G01J 1/44* (2013.01); *G01S 7/4863* (2013.01); *G01S 7/4865* (2013.01);
(Continued)

(58) Field of Classification Search
CPC ................ G01J 1/44; G01J 2001/4466; G01J 2001/448; G01J 11/00; G01J 1/4209;
(Continued)

(56) References Cited

U.S. PATENT DOCUMENTS 9,516,244 B2    12/2016    Borowski
2010/0309288 A1*    12/2010    Stettner .................... H04N 5/33
                                                    348/E13.001
(Continued)

FOREIGN PATENT DOCUMENTS

JP    2008-542706 A    11/2008
JP    2011-209214 A    10/2011
(Continued)

OTHER PUBLICATIONS

Bojan Markovic et al., "Smart-pixel with SPAD detector and time-to-digital converter for time-correlated single photon counting", IEEE Photonics Society, 2010 23rd Annual Meeting of the, IEEE, Piscataway, NJ, USA, Nov. 7, 2010, p. 181-p. 182, XP031858093.

(Continued)

*Primary Examiner* — Tony Ko
(74) *Attorney, Agent, or Firm* — Faegre Drinker Biddle & Reath LLP

(57) ABSTRACT

A photodetector device includes an avalanche photodiode array substrate. A circuit substrate includes time measurement circuits and a clock driver. Each of the time measurement circuit includes a delay line unit, and is arranged to acquire, from an operation result of a delay line, time information indicating timing at which a pulse signal is input from a corresponding avalanche photodiode. The delay line unit is arranged to initiate an operation of the delay line in response to input of the pulse signal to the time measurement circuit, and to stop the operation of the delay line in response to input of a clock signal from a clock driver to the time measurement circuit, and is arranged to detect a time interval shorter than a cycle of the clock signal by the operation of the delay line.

5 Claims, 11 Drawing Sheets

(51) Int. Cl.
*G01S 7/4865* (2020.01)
*G01S 17/894* (2020.01)

(52) U.S. Cl.
CPC . *G01J 2001/448* (2013.01); *G01J 2001/4466* (2013.01); *G01S 17/894* (2020.01)

(58) Field of Classification Search
CPC .... G01S 7/4863; G01S 7/4865; G01S 17/894; H01L 27/14609; H01L 27/14636; H01L 31/02027; H01L 31/107; G04F 10/005; H04N 5/379; H04N 5/37455; H04N 5/378; H01J 27/146
See application file for complete search history.

(56) References Cited

U.S. PATENT DOCUMENTS

| | | | | |
|---|---|---|---|---|
| 2014/0232827 | A1* | 8/2014 | Kumar | H03M 1/002 348/46 |
| 2015/0115131 | A1* | 4/2015 | Webster | H04N 5/369 250/208.1 |

FOREIGN PATENT DOCUMENTS

| | | |
|---|---|---|
| TW | I256097 B | 6/2006 |
| WO | WO-2006/126026 A1 | 11/2006 |
| WO | WO-2016/042734 A1 | 3/2016 |
| WO | WO-2018/088479 A1 | 5/2018 |

OTHER PUBLICATIONS

Jozef Kalisz et al., "Review of methods for time interval measurements with picosecond resolution; Methods for time interval measurements", Metrologia, Institute of Physics Publishing, Bristol, GB, vol. 41, No. 1, Feb. 1, 2004, p. 17-p. 32, XP020019859.

International Preliminary Report on Patentability dated Aug. 6, 2020 for PCT/JP2019/002350.

Aull, Brian, F. et al., "Geiger-Mode Avalanche Photodiodes for Three-Dimensional Imaging," Lincoln Laboratory Journal, 2002, vol. 13, No. 2, p. 335-p. 350.

* cited by examiner

PHOTODETECTOR DEVICE

TECHNICAL FIELD

The present invention relates to a photodetector device.

BACKGROUND ART

A photodetector device in which a plurality of avalanche photodiodes are two-dimensionally arranged is known (for example, Non Patent Literature 1). The plurality of avalanche photodiodes is arranged to operate in a Geiger mode. Generation of a pulse signal in the plurality of avalanche photodiodes is detected by using a plurality of time measurement circuits. The plurality of time measurement circuits operate in response to a clock signal supplied from a clock driver. In the photodetector device, the plurality of time measurement circuits are two-dimensionally arranged in response to the plurality of avalanche photodiodes.

CITATION LIST

Non Patent Literature

Non Patent Literature 1: Brian F. Aull et al. "Geiger-Mode Avalanche Photodiodes for Three-Dimensional Imaging" LINCOLN LABORATORY JOURNAL VOLUME 13, NUMBER 2, 2002

SUMMARY OF INVENTION

Technical Problem

In a configuration in which a plurality of time measurement circuits are two-dimensionally arranged, a clock signal is supplied to each time measurement circuit for every row or for every column. In this case, with regard to the plurality of time measurement circuits which are arranged in the same row or in the same column, a wiring distance from the clock driver to each of the time measurement circuits is not constant. A waveform of the clock signal supplied to the time measurement circuit is more likely to collapse as the wiring length from the clock driver to the time measurement circuit is longer. Specifically, as the wiring length from the clock driver to the time measurement circuit is longer, time taken until the clock signal in the time measurement circuit reaches an upper limit value from a lower limit value, and time taken until the clock signal reaches the lower limit value from the upper limit value is more likely to be longer. The time taken until the clock signal reaches the upper limit value from the lower limit value is rising time of a clock signal. The time taken until the clock signal reaches the lower limit value from the upper limit value is falling time of a clock signal.

In a photodetector device, a clock signal of a relatively high frequency (for example, 500 MHz) is supplied from the clock driver to each of the time measurement circuits to improve time resolution for detecting generation of the pulse signal in each of the avalanche photodiodes. When the frequency of the clock signal is relatively high, that is, a cycle of the clock signal is short, an interval between rising and falling of the clock signal is narrow. As a result, the rising and the falling of the clock signal input to the time measurement circuit may not be appropriately recognized in the time measurement circuit due to collapse of the waveform. In a case where the rising and falling of the clock signal are not appropriately recognized in the time measurement circuit, in the time measurement circuit, time information indicating timing at which a pulse signal from the avalanche photodiode is input to the time measurement circuit is not appropriately acquired. In a case where the time information indicating the timing at which the pulse signal is input to the time measurement circuit is not appropriately acquired, generation of the pulse signal in the corresponding avalanche photodiode is not appropriately detected.

The greater an area of a detection surface of the photodetector device is, the greater a difference in the wiring distance from the clock driver to each of the time measurement circuit is. According to this, in a case where a cycle of the clock signal is relatively short, as the area of the detection surface of the photodetector device is greater, there is a concern that the number of pixel circuits for which time measurement is not appropriately performed may increase.

In the photodetector device, for example, the avalanche photodiode may be constituted by compound semiconductor to increase sensitivity characteristics in a wavelength region of near infrared (NIR) or short wavelength infrared (SWIR). In this case, a plurality of avalanche photodiodes arranged to operate in a Geiger mode are arranged in a semiconductor substrate formed by the compound semiconductor. In a photodetector device in which the avalanche photodiodes are constituted by the compound semiconductor, a dark count rate may increase in response to heat. As the frequency of the clock signal supplied by the clock driver is higher, power consumption increase, and further the amount of heat generated from the clock driver increases. According to this, in the photodetector device, there is a concern that time measurement is performed at erroneous timing due to an increase of dark count.

An object of an aspect of the invention is to provide a photodetector device in which erroneous detection of measurement time and power consumption due to an increase of dark count can be suppressed and in which an improvement of accuracy of measurement time and an increase in size of a photodetection surface are compatible.

Solution to Problem

According to an aspect of the invention, there is provided a photodetector device including an avalanche photodiode array substrate and a circuit substrate. The avalanche photodiode array substrate is formed from compound semiconductor. The avalanche photodiode array substrate is mounted on the circuit substrate. A plurality of avalanche photodiodes are two-dimensionally arranged in the avalanche photodiode array substrate. The plurality of avalanche photodiode is arranged to operate in a Geiger mode. Each of the avalanche photodiodes is connected to a quenching circuit. The circuit substrate includes a plurality of time measurement circuits and a clock driver. The plurality of time measurement circuits are two-dimensionally arranged in the circuit substrate in correspondence with the plurality of avalanche photodiodes. The clock driver is arranged to supply a clock signal to the plurality of time measurement circuits. Each of the time measurement circuits includes a delay line unit including delay line constituted by a plurality of delay elements which are connected in series. Each of the time measurement circuits is arranged to acquire time information from an operation result of the delay line. The acquired time information is time information indicating timing at which a pulse signal is input from a corresponding one of the avalanche photodiodes. The delay line unit is arranged to initiate an operation of the delay line in response to input of the pulse signal output from the corresponding avalanche photodiode to the time measurement circuit. The delay line unit is arranged to stop the operation of the delay line in response to input of the clock signal from the clock driver to the time measurement circuit. The delay line unit is arranged to detect a time interval shorter than a cycle of the clock signal by the operation of the delay line.

In this aspect, the time interval shorter than the cycle of the clock signal is detected by the operation of the delay line. According to this, even in a case where the cycle of the clock signal is long, time resolution for detecting generation of the pulse signal can be secured. In a case where the cycle of the clock signal is long, an interval between rising and falling of the clock signal supplied to the time measurement circuit is wide. Accordingly, even in a case where a wiring length from the clock driver to the time measurement circuit is long and rising time and falling time of the pulse signal supplied to the time measurement circuit is long, the rising and falling of the clock signal is likely to be recognized by the time measurement circuit. As a result, even in a case where an area of a detection surface is larger, the photodetector device can appropriately detect generation of the pulse signal in each of the avalanche photodiode while securing time resolution. In a case where the clock driver is provided in the circuit substrate, a wiring length from the clock driver to the time measurement circuit can be reduced.

In a case where the frequency of the clock signal is reduced, power consumption can be suppressed, and the amount of heat generated from the clock driver can also be reduced. In the photodetector device, the clock driver is provided in a circuit substrate different form the avalanche photodiode array substrate. According to this, a distance between the clock driver and each of the avalanche photodiodes is longer in comparison to a case where the clock driver is formed in the same substrate as in the avalanche photodiode. Since the clock driver is provided in the circuit substrate, a clock driver forming density is reduced. Accordingly, heat generated from the clock driver is less likely to be transferred to the avalanche photodiode. As a result, erroneous detection of measurement time can be suppressed.

In this aspect, each of the time measurement circuits may further include a counter arranged to count the clock signal. The time measurement circuit may be arranged to acquire, from an operation result of the counter and an operation result of the delay line, time information indicating timing at which the pulse signal is input from the corresponding avalanche photodiode. In this case, measurement of time longer than time capable of being measured with only the delay line is realized.

In this aspect, the counter may be arranged to initiate an operation in correspondence with stoppage of the operation of the delay line, and may be arranged to stop the operation of the counter in synchronization with the clock signal from the clock driver. In this case, when the pulse signal is not input from the corresponding avalanche photodiode, the delay line does not operate, and the counter does not operate. According to this, power consumption can be reduced.

In this aspect, the circuit substrate may include a memory and a control circuit arranged to control the time measurement circuit for every time measurement circuit. The control circuit may be arranged to perform reset of the corresponding time measurement circuit in response to input of a reset signal to the control circuit, and to stop input of the clock signal to the counter in response to input of a stop signal to the control circuit. The reset signal and the stop signal may be synchronized with the clock signal. The delay line unit may be arranged to store, in the memory, the number of the delay elements which have operated from input of the pulse signal until an input of the clock signal from the clock driver to the time measurement circuit when the pulse signal is output from the corresponding avalanche photodiode after the reset signal is input to the corresponding time measurement circuit. The counter may be arranged to store, in the memory, the number of the clock signal counted from stoppage of the operation of the delay line until input of the stop signal to the counter.

In this aspect, when viewed from a thickness direction of the avalanche photodiode array substrate, the plurality of time measurement circuits may be two-dimensionally arranged in a region that overlaps a photodetection region in which the plurality of avalanche photodiodes are two-dimensionally arranged, and the clock driver may be disposed in a region that does not overlap the photodetection region. In this case, an influence of heat generated in the clock driver on each of the avalanche photodiodes can be further reduced.

In this aspect, the quenching circuit may be an active quenching circuit and may be formed in the circuit substrate. In a case where the semiconductor substrate is formed from compound semiconductor, there is a concern that a lot of dark counts and after pulses may occur in comparison to a case where the semiconductor substrate is formed from silicon. Since the active quenching circuit is formed in the circuit substrate, the quenching time is easily realized in an arbitrary manner, and a noise due to the dark counts and the after pulses is likely to be reduced.

In this aspect, the avalanche photodiode array substrate and the circuit substrate may be connected by a bump electrode. In this case, an influence of heat generated in the clock driver on each of the avalanche photodiodes can be further reduced in comparison to a case where the avalanche photodiode array substrate and the circuit substrate are connected by direct bonding or the like.

The circuit substrate may include a silicon substrate. In this case, a manufacturing process of a configuration including the time measurement circuit and the clock driver can be simplified.

Advantageous Effects of Invention

According to the aspect of the invention, it is possible to provide a photodetector device in which erroneous detection of measurement time and power consumption due to an increase of dark count can be suppressed and in which an improvement of accuracy of measurement time and an increase in size of a photodetection surface are compatible.

DESCRIPTION OF EMBODIMENTS

Figure 1:
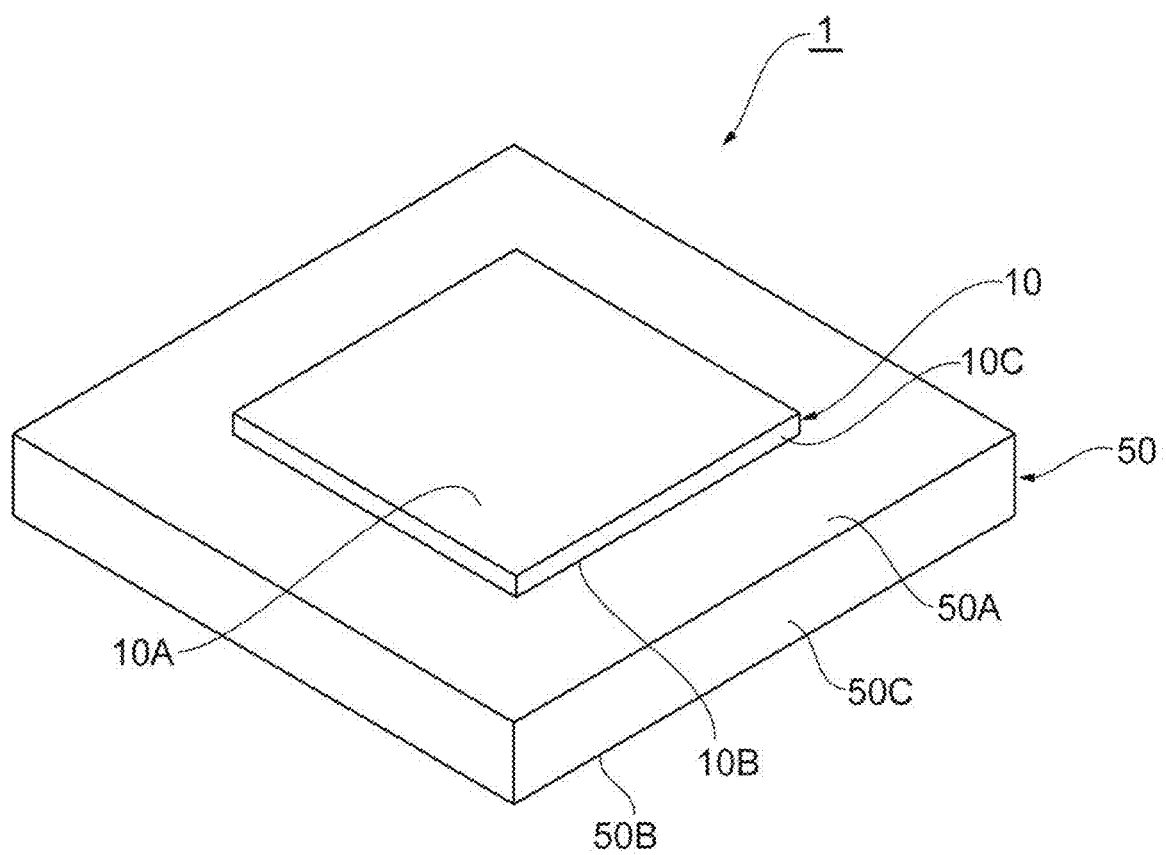
FIG. 1 is a perspective view of a photodetector device according to an embodiment.

Hereinafter, an embodiment of the invention will be described in detail with reference to the accompanying drawings. Note that, the same reference numeral will be given to the same elements or elements having the same function, and redundant description thereof will be omitted.

Figure 2:
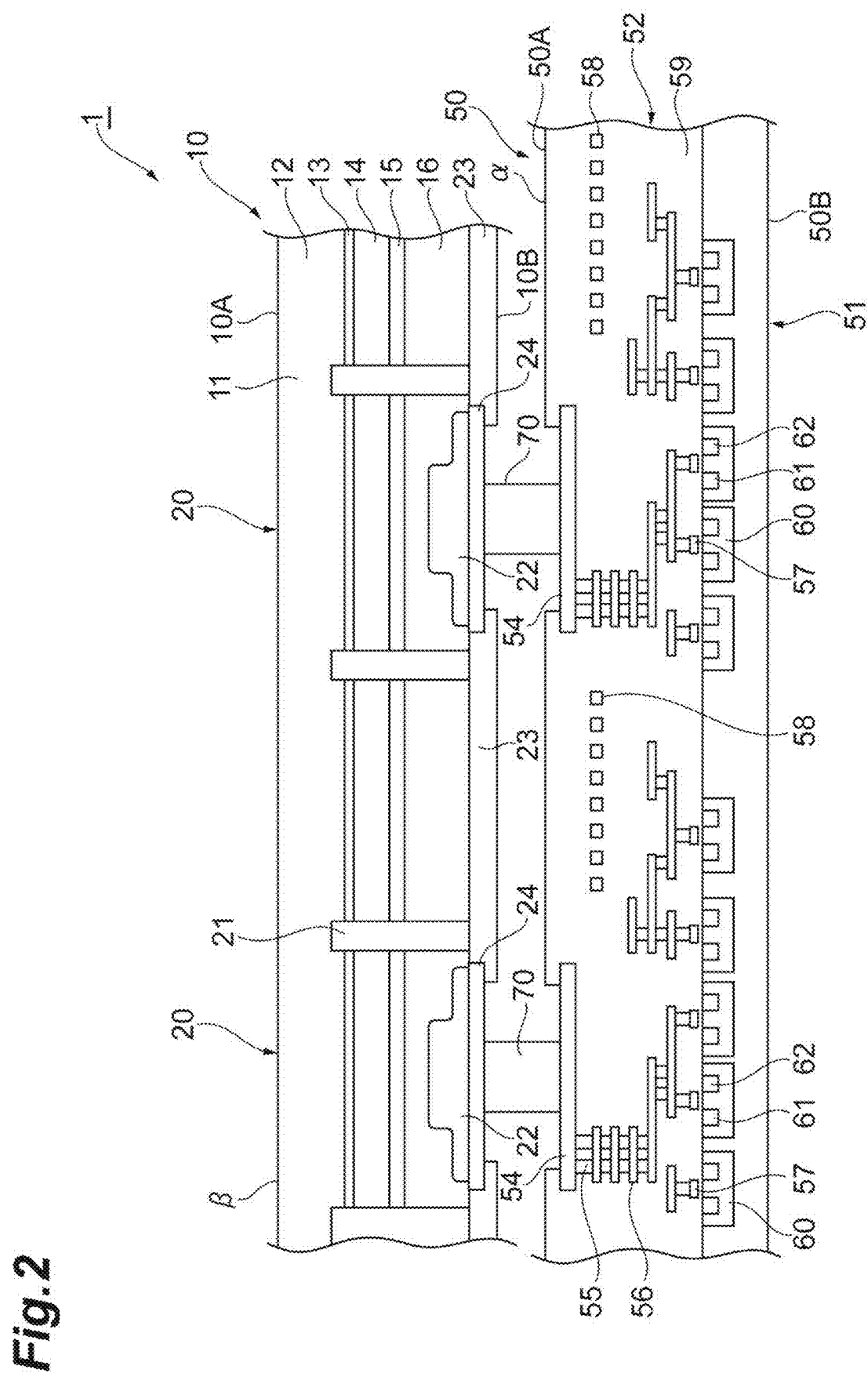
FIG. 2 is a view illustrating a cross-sectional configuration of the photodetector device.
Figure 3:
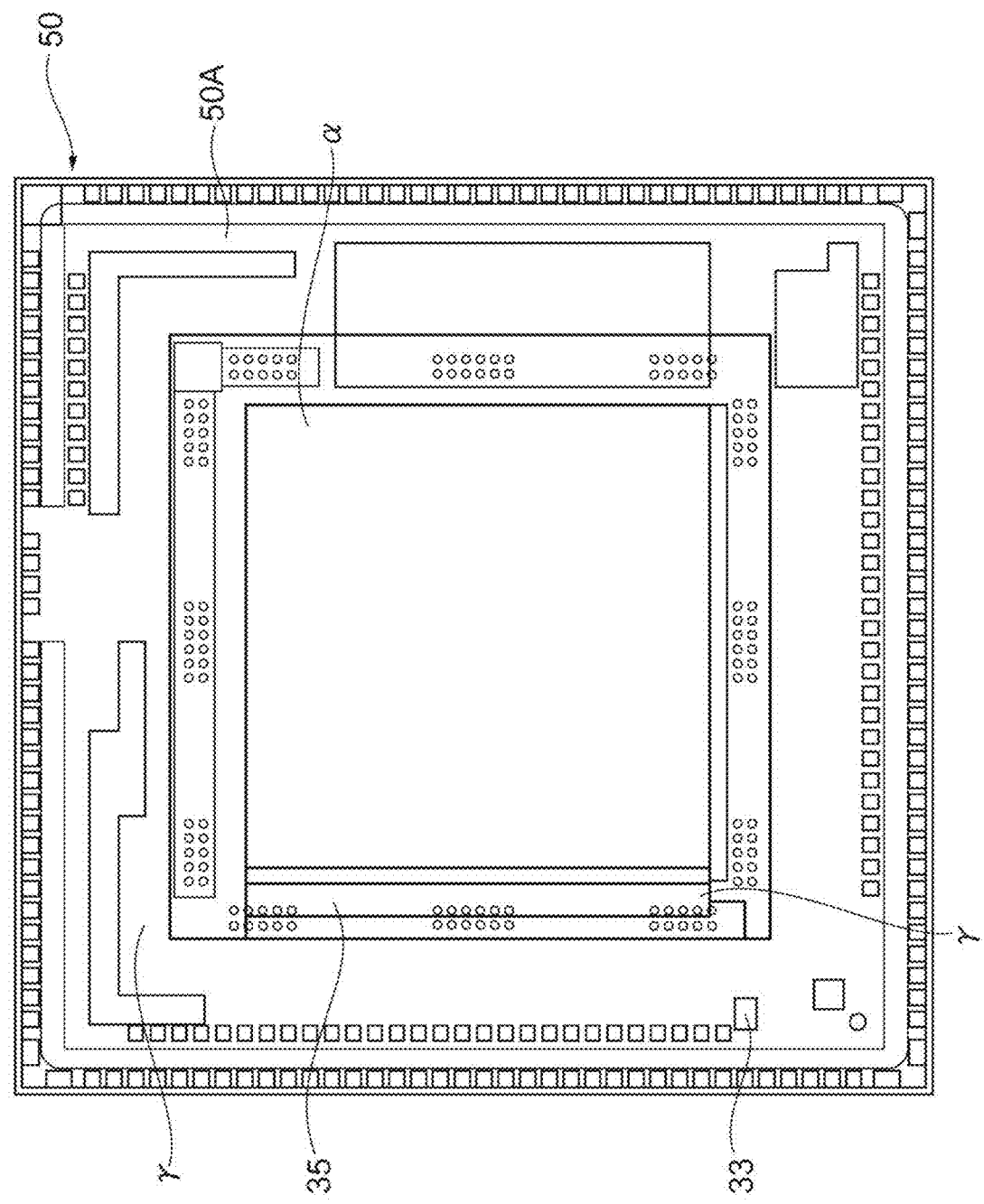
FIG. 3 is a plan view of a circuit substrate.
Figure 4:
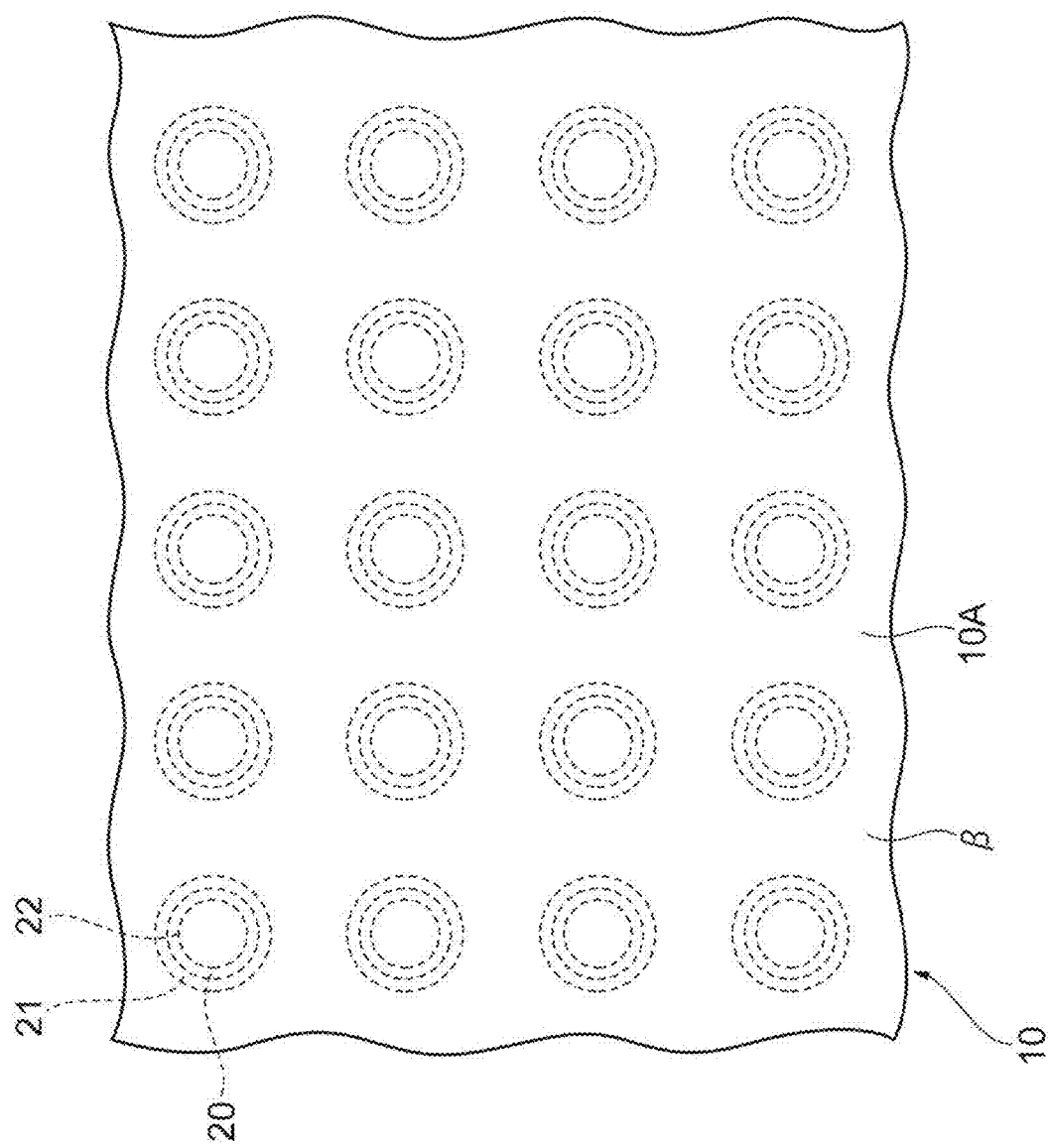
FIG. 4 is a plan view of a photodetection region of an avalanche photodiode array substrate.
Figure 5:
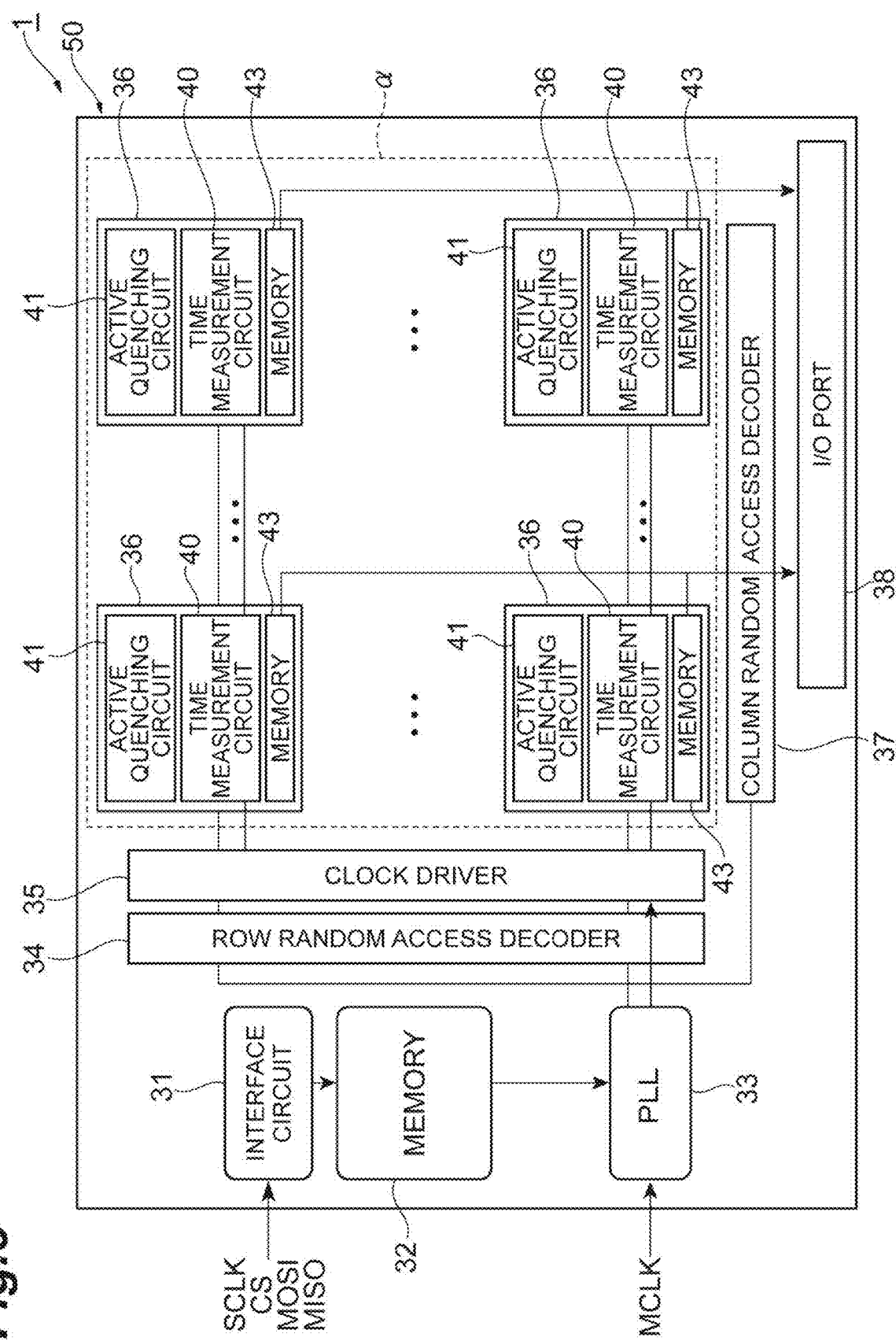
FIG. 5 is a view illustrating a configuration of a circuit substrate.
Figure 6:
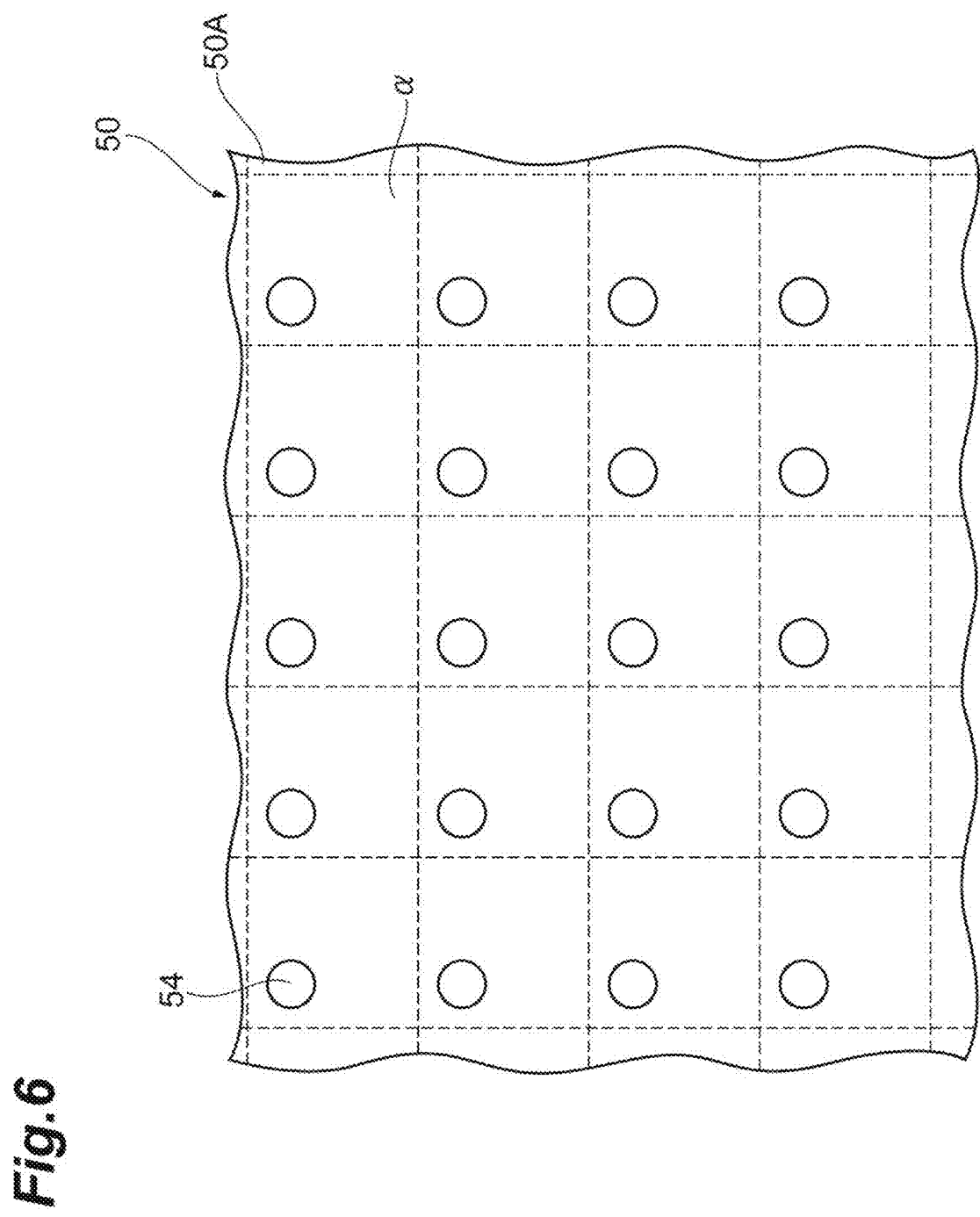
FIG. 6 is a plan view of a mounting region of the circuit substrate.
Figure 7:
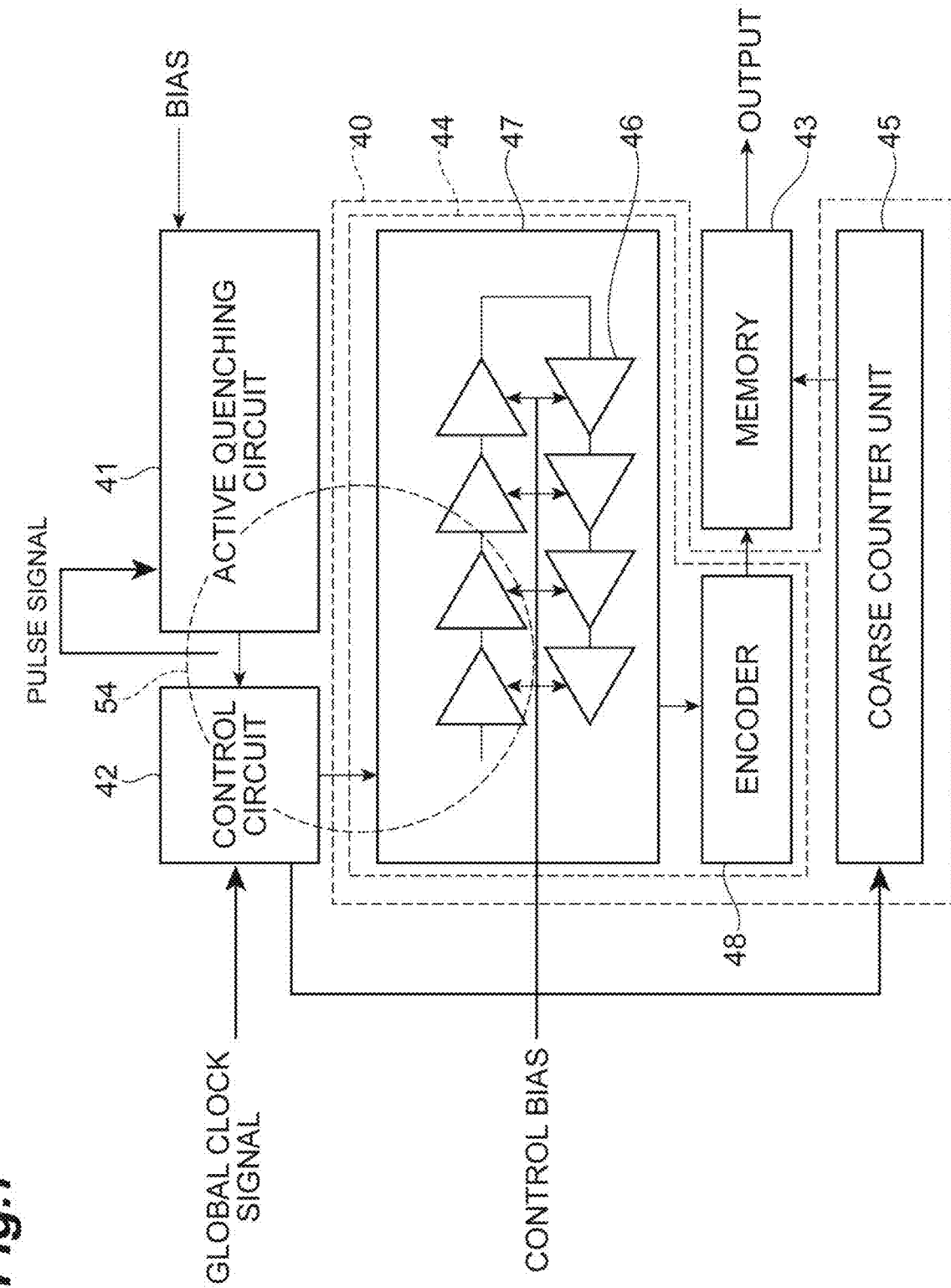
FIG. 7 is a view illustrating a configuration of a pixel circuit.

First, a whole configuration of a photodetector device according to this embodiment will be described with reference to FIG. 1 to FIG. 7. FIG. 1 is a perspective view of the photodetector device according to this embodiment. FIG. 2 is a view illustrating a cross-sectional configuration of the photodetector device according to this embodiment. In FIG. 2, hatching is omitted to improve visibility. FIG. 3 is a plan view of a circuit substrate. FIG. 4 is a plan view illustrating a part of an avalanche photodiode array substrate. FIG. 5 is a view illustrating a configuration of a circuit substrate. FIG. 6 is a plan view illustrating a part of the circuit substrate. FIG. 7 is a view illustrating a configuration of a pixel circuit.

As illustrated in FIG. 1, a photodetector device 1 includes an avalanche photodiode array substrate 10 and a circuit substrate 50. Hereinafter, "avalanche photodiode" is referred to as "APD". "Avalanche photodiode array substrate" is referred to as "APD array substrate". The circuit substrate 50 is disposed to face the APD array substrate 10. The APD array substrate 10 and the circuit substrate 50 have a rectangular shape in plan view.

The APD array substrate 10 includes a main surface 10A and a main surface 10B which are opposite to each other, and a side surface 10C. The circuit substrate 50 includes a main surface 50A and a main surface 50B which are opposite to each other, and a side surface 50C. The main surface 10B of the APD array substrate 10 faces the main surface 50A of the circuit substrate 50. A plan parallel to the respective main surfaces of the APD array substrate 10 and the circuit substrate 50 is an XY-axis plan, and a direction orthogonal to the respective main surface is a Z-axis direction.

The side surface 50C of the circuit substrate 50 is located on an outer side in the XY-axis plane direction in comparison to the side surface 10C of the APD array substrate 10. That is, in plan view, an area of the circuit substrate 50 is greater than an area of the APD array substrate 10. The side surface 10C of the APD array substrate 10 and the side surface 50C of the circuit substrate 50 may be flush with each other. In this case, in plan view, an outer edge of the APD array substrate 10 and an outer edge of the circuit substrate 50 match each other.

A glass substrate may be disposed on the main surface 10A of the APD array substrate 10. The glass substrate and the APD array substrate 10 are optically connected to each other by an optical adhesive. The glass substrate may be directly formed on the APD array substrate 10. The side surface 10C of the APD array substrate 10 and a side surface of the glass substrate may be flush with each other. In this case, in plan view, the outer edge of the APD array substrate 10 and the outer edge of the glass substrate match each other. In addition, the side surface 10C of the APD array substrate 10, the side surface 50C of the circuit substrate 50, and the side surface of the glass substrate may be flush with each other. In this case, in plan view, the outer edge of the APD array substrate 10, the outer edge of the circuit substrate 50, and the outer edge of the glass substrate match each other.

The APD array substrate 10 includes an N-type semiconductor substrate 11 formed from compound semiconductor. The semiconductor substrate 11 includes a substrate 12 formed from InP that forms the main surface 10A. A buffer layer 13 formed from InP, an absorption layer 14 formed from InGaAsP, an electric field relaxing layer 15 formed from InGaAsP, a multiplication layer 16 formed from InP are formed on the substrate 12 in this order from the main surface 10A side to the main surface 10B side. The absorption layer 14 may be formed from InGaAs. The semiconductor substrate 11 may be formed from GaAs, InGaAs, AlGaAs, InAlGaAs, or the like.

As illustrated in FIG. 2, the APD array substrate 10 is mounted on the circuit substrate 50. The APD array substrate 10 and the circuit substrate 50 are connected to each other by the bump electrode 70. Specifically, as illustrated in FIG. 3, the APD array substrate 10 is connected to the bump electrode 70 over a mounting region α disposed at the center of the circuit substrate 50 when viewed from a thickness direction of the APD array substrate 10. In this embodiment, the mounting region α has a rectangular shape.

The APD array substrate 10 includes a plurality of APDs 20 arranged to operate in a Geiger mode. As illustrated in FIG. 4, the plurality of APDs 20 are two-dimensionally arranged in a photodetection region β of the semiconductor substrate 11 when viewed from the thickness direction of the APD array substrate 10. The photodetection region β has a rectangular shape, and overlaps the mounting region α of the circuit substrate 50 when viewed from the thickness direction of the APD array substrate 10. Each of the APDs 20 is surrounded by an insulating portion 21 when viewed from the thickness direction of the APD array substrate 10. The APD 20 includes a P-type active area 22 that is formed by doping the multiplication layer 16 with impurities from the main surface 10B side. Examples of the doping impurities include zinc (Zn). For example, the insulating portion 21 is provided by forming a polyimide film in a trench formed through dry etching or wet etching. The active area 22 formed in a circular shape when viewed from the thickness direction, and the insulating portion 21 is formed in an annular shape along an edge of the active area 22. The insulating portion 21 reaches the substrate 12 from the main surface 10B side of the semiconductor substrate 11 in the thickness direction of the APD array substrate 10.

The APD array substrate 10 includes an insulating layer 23 and a plurality of electrode pads 24. The insulating layer 23 covers the semiconductor substrate 11 on the main surface 10B side. Each of the electrode pads 24 is formed on the semiconductor substrate 11 on the main surface 10B side for every APD 20, and is in contact with the active area 22. The electrode pad 24 is exposed from the insulating layer 23, and is connected to the circuit substrate 50 through the bump electrode 70.

The circuit substrate 50 includes the main surface 50A and the main surface 50B, and is connected to the APD array substrate 10 on the main surface 50A side through the bump electrode 70. As illustrated in FIG. 5, the circuit substrate 50 includes an interface circuit 31, a memory 32, a phase locked loop (PLL) 33, a row random access decoder 34, a clock driver 35, a plurality of pixel circuit 36, a column random access decoder 37, and an I/O port 38.

For example, the interface circuit 31 corresponds to a serial peripheral interface (SPI) bus. The interface circuit 31 receives a digital signal such as serial clock (SCLK), chip select (CS), master output/slave input (MOSI), and master input/slave output (MISO) which are input from the outside, and stores in the memory 32 register setting information included in the signal.

The PLL 33 generates a global clock signal on the basis of a master clock (MCLK) input from the outside and data stored in the memory 32, and transmits the generated global clock signal to the clock driver 35. The PLL 33 includes a programmable frequency divider, and sets a frequency division number with reference to data stored in the memory 32. That is, the frequency division number of the PLL 33 can be set to an arbitrary value in response to input to the interface circuit 31 from the outside. In this embodiment, a frequency of a master clock input from the outside is 10 MHz, and a frequency of the global clock signal generated by the PLL 33 is 200 MHz. The PLL 33 outputs a control bias for controlling a time measurement circuit 40 of each of the plurality of the pixel circuits 36 in combination with the global clock signal.

The clock driver 35 supplies a global clock signal to each of the pixel circuits 36. Each of the plurality of pixel circuits 36 is electrically connected to a corresponding APD 20 through the bump electrode 70. A pulse signal is input to the pixel circuit 36 from the corresponding APD 20, and the pixel circuit 36 processes the pulse signal that is input. The signal processed by the pixel circuit 36 is output to the I/O port 38 at timing corresponding to a signal from the row random access decoder 34 and the column random access decoder 37.

The plurality of pixel circuits 36 are two-dimensionally arranged in correspondence with the respective APDs 20 in the mounting region α that overlaps the photodetection region β when viewed from the thickness direction of the APD array substrate 10. As illustrated in FIG. 3, the PLL 33 and the clock driver 35 are disposed in a non-mounting region γ that does not overlap the photodetection region β when viewed from the thickness direction of the APD array substrate 10.

As illustrated in FIG. 2, the circuit substrate 50 includes a silicon substrate 51 and a wiring layer 52 staked on the silicon substrate 51 in the mounting region α. The wiring layer 52 includes an electrode pad 54, a plurality of vias 55, a plurality of metal layers 56 which are disposed in layers different from each other, a plurality of gates 57 which form a metal-oxide-semiconductor field-effect transistor (MOSFET), a plurality of read-out buses 58, and an insulating layer 59 in each of the pixel circuits 36. The electrode pad 54 formed for every pixel circuit 36 on the main surface 50A side, and is connected to the electrode pad 24 of the APD array substrate 10 through the bump electrode 70. That is, as illustrated in FIG. 6, a plurality of the electrode pads 54 are two-dimensionally arranged on the main surface 50A side.

The read-out bus 58 is connected to the I/O port 38. The read-out bus 58 is arranged closer to the main surface 50A than the main surface 50B. Accordingly, the arrangement can reduce parasitic capacitance that occurs in the read-out bus 58. Accordingly, even in a case where a detection surface of a detector is large, a signal output from a pixel circuit can be read out with a reduced delay. The parasitic capacitance that occurs in the read-out bus 58 occurs due to an influence of the silicon substrate 51 and a circuit that is formed in the vicinity thereof.

The plurality of vias 55 is formed to penetrate through the insulating layer 59, and electrically connects the electrode pad 54, the plurality of metal layers 56, and the plurality of gates 57. Each of the APDs 20 is connected to a gate 57 of a corresponding pixel circuit 36 through the electrode pad 24, the bump electrode 70, the electrode pad 54, and the plurality of vias 55, and the plurality of metal layers 56. A plurality of wells 60 are formed in the silicon substrate 51 for every pixel circuit 36. A source 61 and a drain 62 corresponding to each of the gates 57 are formed in each of the plurality of wells 60.

As illustrated in FIG. 7, each of the pixel circuits 36 includes a time measurement circuit 40, an active quenching circuit 41, a control circuit 42, and a readable memory 43. That is, the active quenching circuit 41, the control circuit 42, and the memory 43 are disposed for every time measurement circuit 40. A plurality of the time measurement circuits 40 are two-dimensionally arranged in the mounting region α of the circuit substrate 50 when viewed from the thickness direction of the APD array substrate 10. Each of the plurality of time measurement circuit 40 is constituted by at least an MOSFET including the gate 57, the source 61, and the drain 62.

The active quenching circuit 41 is formed in the circuit substrate 50, and is connected to a corresponding APD 20 through the electrode pad 24, the bump electrode 70, and the electrode pad 54. A pulse signal output from the corresponding APD 20 is input to the control circuit 42 through the active quenching circuit 41. A bias for adjusting quenching time is also applied to the active quenching circuit 41 from an interconnection (not illustrated).

The pulse signal from the corresponding APD 20, the global clock signal supplied from the clock driver 35, a reset signal, and a stop signal are input to the control circuit 42. For example, the reset signal and the stop signal are generated on an external board that controls the circuit substrate 50. The control circuit 42 supplies the pulse signal from the corresponding APD 20, and the global clock signal from the clock driver 35 to the time measurement circuit 40. The control circuit receives the reset signal and resets a corresponding time measurement circuit 40, and receives the pulse signal from the APD 20 and gives an instruction for initiation of an operation of the time measurement circuit 40. The reset signal is a signal for resetting the control circuit 42 and the time measurement circuit 40 to enter a standby state. The control circuit 42 stops input of the clock signal to a coarse counter unit 45 in response to input of the stop signal for giving an instruction for stoppage of the operation of the corresponding time measurement circuit 40 from an external board of the circuit substrate 50. The stop signal is synchronized with the global clock signal that is input.

The memory 43 stores a signal output from the time measurement circuit 40. The signal stored in the memory 43 is output the I/O port 38 through the read-out bus 58 in response to signals from the row random access decoder 34 and the column random access decoder 37.

The time measurement circuit 40 includes a fine unit 44 that detects a time interval shorter than a cycle of the global clock signal, and the coarse counter unit 45 that counts the global clock signal. The fine unit 44 is included in a delay line unit. The coarse counter unit 45 is included in a counter. The time measurement circuit 40 acquires time information indicating timing at which the pulse signal is input from the corresponding APD 20 on the basis of an operation result of the fine unit 44 and the global clock signal generated by the clock driver 35. In this embodiment, the time measurement circuit 40 measures time from input of the pulse signal from the corresponding APD 20 until input of the stop signal in accordance with the operation result of the fine unit 44 and an operation result of the coarse counter unit 45 which are stored in the memory 43. According to this, it is possible to derive timing at which the pulse signal is input from the corresponding APDs 20 with respect to stop signal.

The fine unit 44 includes a delay line 47 in which a plurality of delay elements 46 are connected in series, and an encoder 48. In this embodiment, the plurality of delay elements 46 are sixteen buffers which are connected in series. The delay elements 46 have the same delay amount. An error to a certain degree that does not have an influence on measurement time in the time measurement circuit 40 is included in the same delay amount. The delay amount in each of the delay element 46 is a time interval shorter than the cycle of the global clock signal. The delay element 46 is controlled by the control bias supplied from the PLL 33. The encoder 48 stores the delay amount delayed by the delay line 47 in the memory 43. That is, an operation result of the delay line 47 is stored in the memory 43. The coarse counter unit 45 counts the global clock signal, and stores a count result in the memory 43. That is, an operation result of the coarse counter unit 45 is stored in the memory 43.

A specific operation of the time measurement circuit 40 will be described with reference to FIG. 8. The control circuit 42 is reset in synchronization with rising of the global clock signal Global CLK in response to input of the reset signal Reset (timing t1 in FIG. 8). The reset signal Reset represents light emission of a light source such as a laser and is generated on a board that controls the circuit substrate 50. After the control circuit 42 is reset in correspondence with the reset signal Reset, the fine unit 44 initiates an operation of the delay line 47 in response to input of a pulse signal SPADIN output from the APD 20 connected to the fine unit 44 to the time measurement circuit 40 (timing t2 in FIG. 8). The fine unit 44 stops the operation of the delay line 47 in response to input of the global clock signal Global CLK after initiation of the operation of the delay line 47 to the time measurement circuit 40 (timing t3 in FIG. 8).

The fine unit 44 continues the operation of the delay line 47 until the subsequent rising of the global clock signal is input after a pulse signal output from the APD 20 is input. Specifically, in the fine unit 44, a pulse signal output from a corresponding APD 20 is input to the time measurement circuit 40, and a pulse propagates through the delay line 47. Rising of the global clock is input before the propagating pulse reaches the end of the delay line 47.

The encoder 48 generates a signal (signal indicated by Fine Encode in FIG. 8) that varies in correspondence with a signal (signal indicated by Delay Line in FIG. 8) from the delay line 47, and counts the number of operation stages of the delay elements 46 of the delay line 47 to convert the signal into a binary signal. The delay amount in each of the delay elements 46 is a time interval shorter than the cycle of the global clock signal, and thus the fine unit 44 detects a time interval shorter than the cycle of the global clock signal by the operation of the delay line 47. Specifically, after the corresponding time measurement circuit 40 is reset, the encoder 48 counts the number of delay elements which have operated until the global clock signal is input to the time measurement circuit 40 after the pulse signal output from the corresponding to APD 20 is input to the time measurement circuit 40. In the example illustrated in FIG. 8, the encoder 48 sets the number of the operated delay elements 46 to four.

The encoder 48 stores the number of the operated delay elements 46 in the memory 43. The encoder 48 expresses the number of the operated delay elements 46 in binary. That is, the encoder 48 expresses a time interval from initiation to stoppage of the operation of the delay line 47 in binary, and a user can understand a measurement time by multiplying the binary value by the delay amount of the delay element 46. The encoder 48 stores the binary data in the memory 43.

The coarse counter unit 45 initiates an operation when the operation of the delay line 47 is stopped. When initiating an operation, the coarse counter unit 45 counts rising of the global clock signal until the stop signal is input to the control circuit 42. Specifically, the coarse counter unit 45 generates a signal Coarse Count that varies in correspondence with rising of the global clock signal, and performs global cock signal counting.

The operation of the coarse counter unit 45 is stopped by control of the control circuit 42. In other words, when a stop signal Stop is input from the outside of the circuit substrate 50 (timing t4 in FIG. 8), the control circuit 42 stops input of the global clock signal to the coarse counter unit 45. That is, in this embodiment, the coarse counter unit 45 initiates the operation in response to stoppage of the operation of the delay line 47, and stops the operation in response to input of the stop signal to the control circuit 42. The stop signal is synchronized with the global clock signal, and thus the coarse counter unit 45 stops the operation in synchronization with the global signal.

Figure 8:
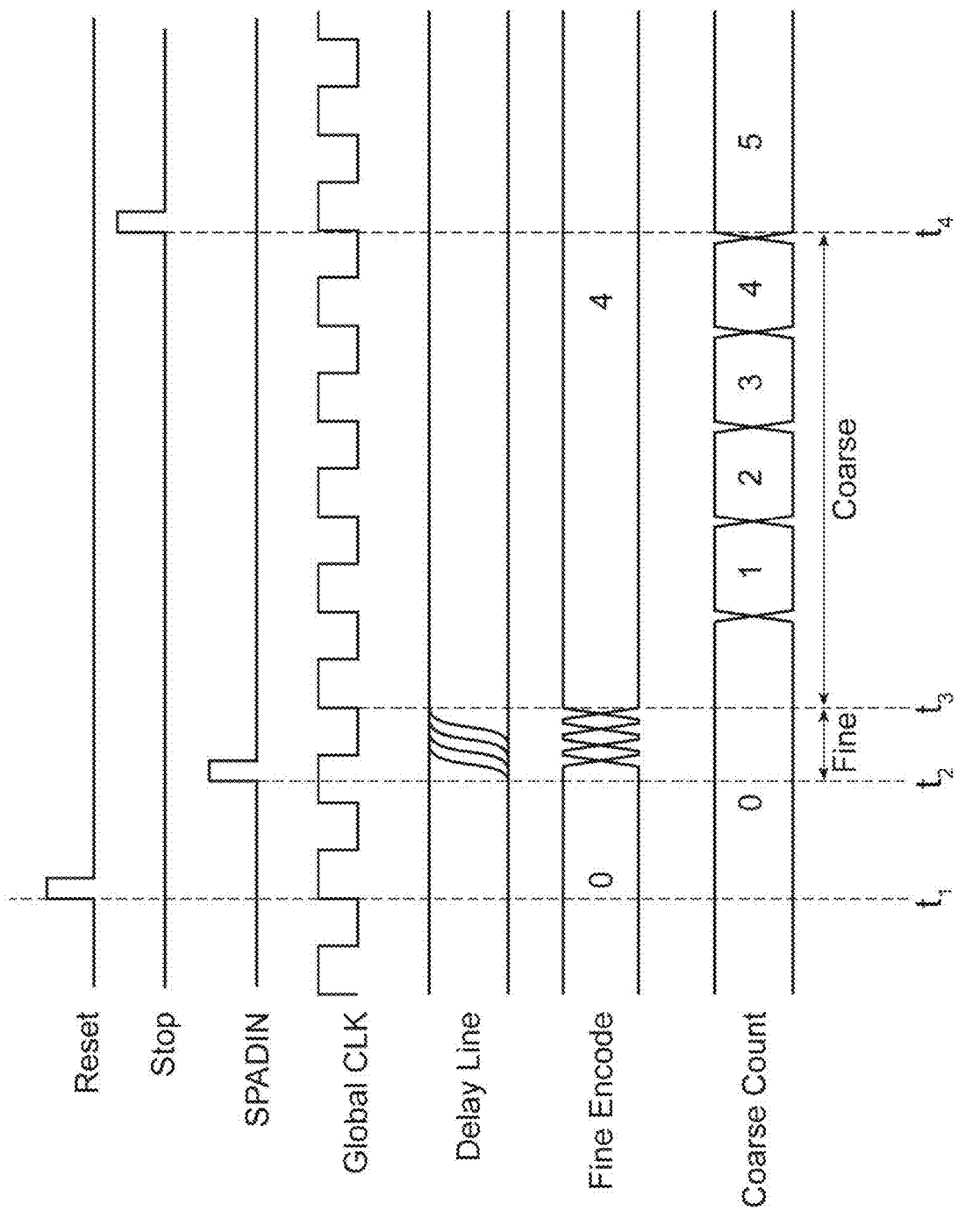
FIG. 8 is a timing chart illustrating an operation of a time measurement circuit.

In the example illustrated in FIG. 8, the coarse counter unit 45 sets the number of rising of the global clock signal to five. The coarse counter unit 45 stores the counted number in the memory 43. In other words, the coarse counter unit 45 stores in the memory 43 the number of the counted global clock signals counted until the stop signal is input after the operation of the delay line 47 is stopped. It is possible to compute time until the stop signal is input after the delay line 47 of the fine unit 44 is stopped by multiplying the number counted by the coarse counter unit 45 by the cycle of the global clock signal.

As described above, in the time measurement circuit 40, the fine unit 44 stores in the memory 43 the delay amount until rising of the global clock signal is input after the pulse signal from the APD 20 is input in the memory 43, that is, a time interval. In the time measurement circuit 40, the coarse counter unit 45 stores in the memory 43 the number of risings of the global clock signal until a stop signal is input after the operation of the delay line 47 of the fine unit 44 is stopped. That is, the time measurement circuit 40 measures, from an operation result of the delay line in the fine unit 44 and an operation result of the coarse counter unit 45, time until the stop signal is input after the pulse signal is input from the corresponding APD 20. Accordingly, the time measurement circuit 40 acquires time information indicating timing at which the pulse signal is input from the APD 20 with respect to the stop signal.

Figure 9:
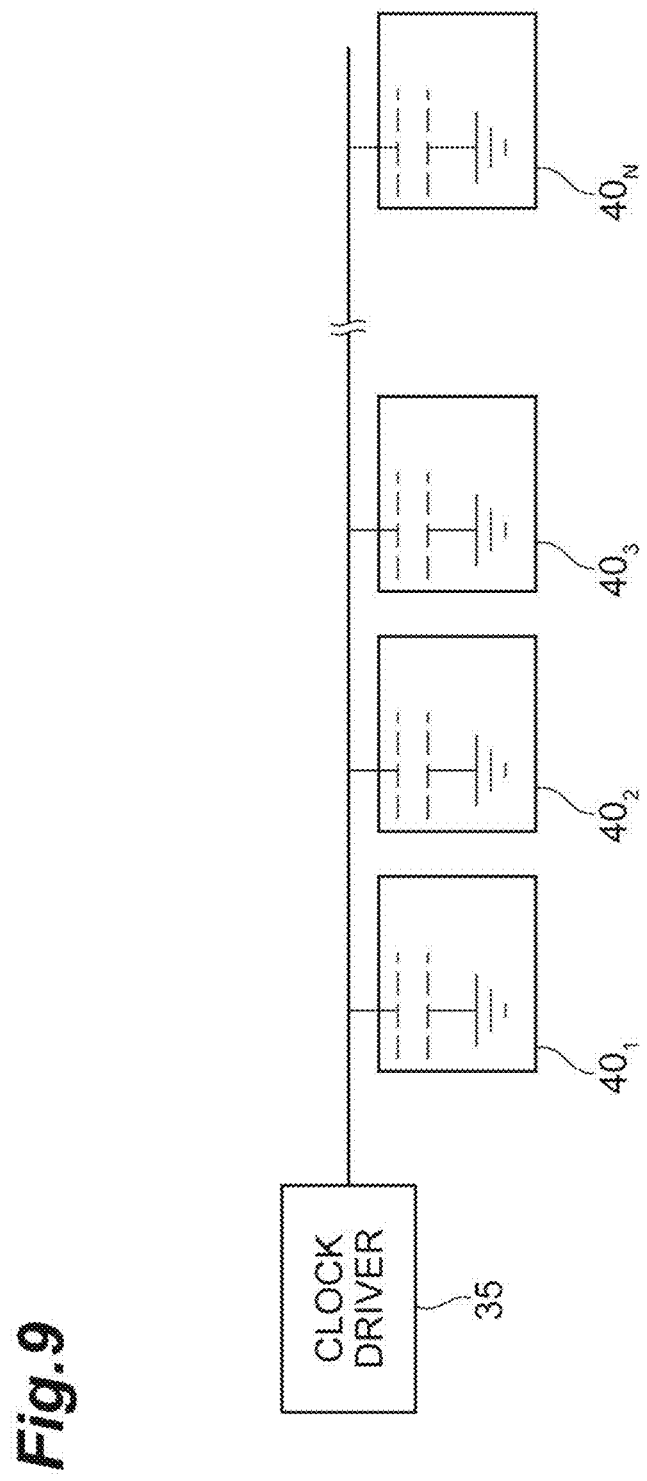
FIG. 9 is a view illustrating a time measurement circuit to which a global clock signal is supplied.
Figure 10:
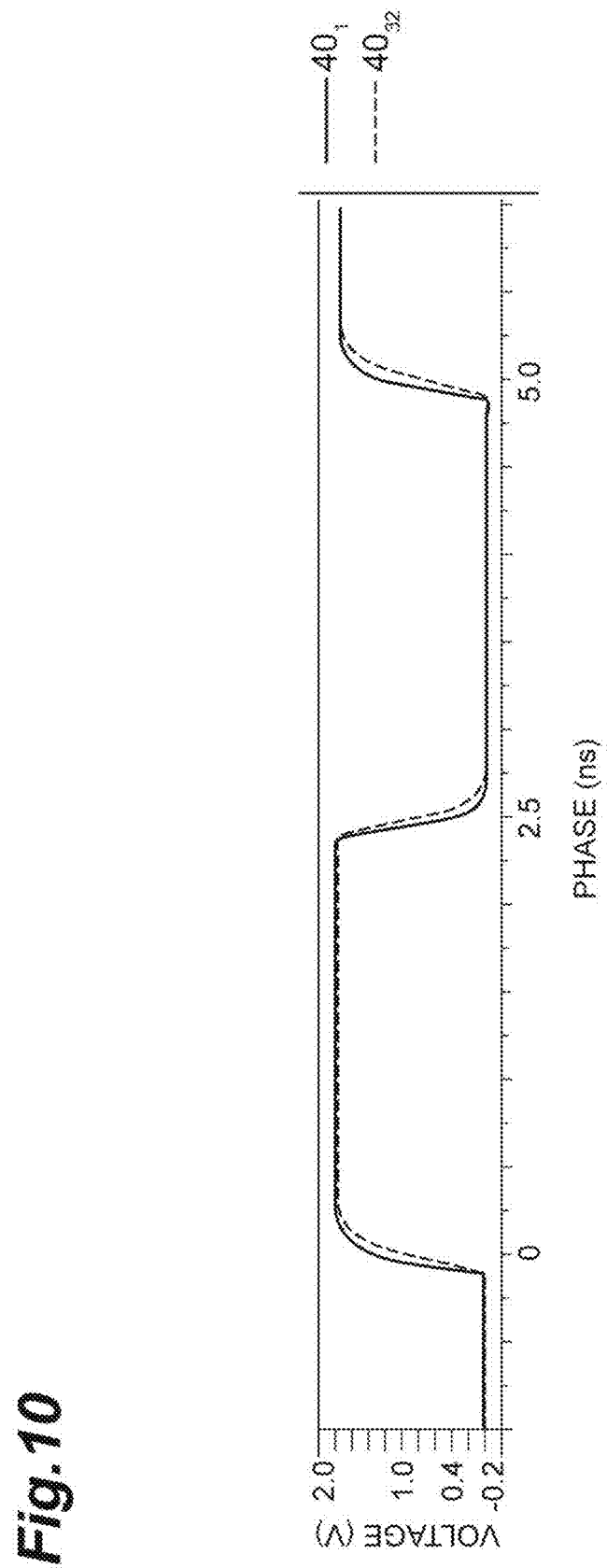
FIG. 10 is a view illustrating comparison of waveforms of the global clock signals supplied to respective time measurement circuits.
Figure 11:
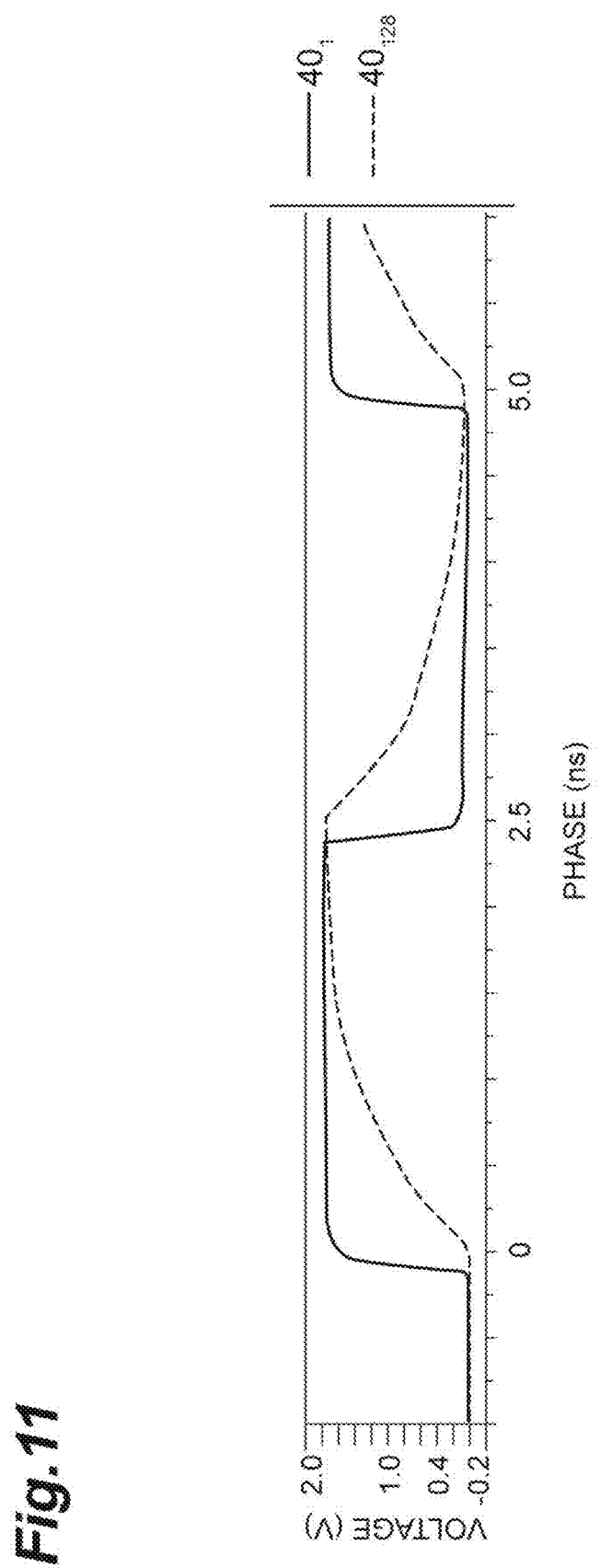
FIG. 11 is a view illustrating comparison of waveforms of the global clock signals supplied to the respective time measurement circuits.

Next, an operational effect of the photodetector device 1 will be described with reference to FIG. 9 to FIG. 11. FIG. 9 illustrates a time measurement circuit to which the global clock signal is supplied. FIG. 10 and FIG. 11 illustrate comparison of waveforms of the global clock signal supplied to respective time measurement circuits.

The clock driver 35 supplies the global clock signal for every column of the plurality of time measurement circuits 40 which are two-dimensionally arranged in the mounting region α. FIG. 9 illustrates an electrical connection relationship between N pieces of time measurement circuits $40_1$ to $40_N$ arranged at a pitch of 100 μm in the same row and the clock driver 35. "N" is an arbitrary integral. As illustrated in FIG. 9, the time measurement circuits $40_1$ to $40_N$ which are arranged in the same row are connected in parallel by one line connected to the clock driver 35. Among the N pieces of time measurement circuits $40_1$ to $40_N$, the time measurement circuit $40_1$ has the shortest wiring distance from the clock driver 35. Among the N pieces of time measurement circuits $40_1$ to $40_N$, the time measurement circuit $40_N$ has the longest wiring distance from the clock driver 35.

FIG. 10 and FIG. 11 illustrate waveforms of global clock signals supplied to the time measurement circuit $40_1$ and the time measurement circuit $40_N$ in a case where the cycle of the global clock signals output from the clock driver 35 is 5 ns (frequency: 200 MHz). In a graph illustrated in FIG. 10, a unit in the horizontal axis is a phase (ns), and a unit in the vertical axis is a voltage (V).

FIG. 10 illustrates comparison between the time measurement circuit $40_1$ and a time measurement circuit $40_{32}$. FIG. 11 illustrates comparison between the time measurement circuit $40_1$ and a time measurement circuit $40_{128}$. In other words, FIG. 10 illustrates comparison between a waveform of a global clock signal supplied to the time measurement circuit 40 closest to the clock driver 35 among a plurality of the time measurement circuits 40 arranged in the same row, and a waveform of a global clock signal supplied to the $32^{nd}$ time measurement circuit 40 from the clock driver 35. FIG. 11 illustrates comparison between the waveform of the global clock signal supplied to the time measurement circuit 40 closest to the clock driver 35 among the plurality of time measurement circuits 40 arranged in the same row, and a waveform of a global clock signal supplied to the $128^{th}$ time measurement circuit 40 from the clock driver 35.

As illustrated in FIG. 10 and FIG. 11, a difference between the waveforms of the global clock signals supplied to the time measurement circuit $40_1$ and the time measurement circuit $40_{32}$ is greater than a difference between the waveforms of the global clock signals supplied to the time measurement circuit $40_1$ and the time measurement circuit $40_{128}$. In this manner, as the distance from the clock driver 35 to the time measurement circuit 40 is longer, collapse of the waveform of the global clock signal supplied to the time measurement circuit 40 is further significantly exhibited.

In a case where the frequency of the global clock signal is 200 MHz, a cycle from rising to falling is 2.5 ns. In the time measurement circuit $40_{128}$, time taken until a voltage reaches the upper limit value from the lower limit value, that is, rising time, and time taken until the voltage reaches the lower limit value from the upper limit value, that is, falling time are approximately 2.5 ns. Accordingly, in a case where the frequency of the global clock signal is set to be higher than 200 MHz, the cycle is shorter than the rising time and the falling time, and thus there is a concern that rising of the global clock signal is not appropriately recognized by the time measurement circuit 40 or the control circuit 42. That is, in the time measurement circuit $40_{128}$, due to the influence of the waveform collapse, timing at which the delay line 47 stops an operation after the pulse signal is input to the time measurement circuit 40 from the APD 20, and the coarse counter unit 45 initiates the operation may not be appropriately detected. In other words, in a case where the plurality of time measurement circuits 40 are arrange at a pitch of 100 μm, in a pixel including a $128^{th}$ or later time measurement circuit 40 from the clock driver 35, arrival time of the pulse signal in the APD 20 may not be appropriately recorded.

In the photodetector device 1, each of the time measurement circuit 40 acquires time information indicating timing at which the pulse signal is input to the time measurement circuit 40 from a corresponding APD 20 from an operation result of the delay line 7. The fine unit 44 detects a time interval shorter than the cycle of the global clock signal by an operation of the delay line 47.

In this manner, since the time interval shorter than the cycle of the global clock signal is detected by the operation of the delay line 47, even when the cycle of the global clock signal is long, it is possible to secure time resolution for detecting occurrence of the pulse signal. When the cycle of the global clock signal is long, an interval between rising and falling of the global clock signal supplied to the time measurement circuit 40 is wide. According to this, even in a case where the wiring length from the clock driver 35 to the time measurement circuit 40 is long and, as a result, the rising time and the falling time of the pulse signal supplied to the time measurement circuit 40 are long, the rising and falling of the global clock signal are easily recognized by the time measurement circuit 40. That is, an improvement of accuracy of measurement time and an increase in size of the photodetection surface are compatible, and thus photodetection accuracy can be improved.

For example, in an example illustrated in FIG. 11, when the frequency of the global clock signal can be suppressed to 200 MHz, in a case where the time measurement circuit 40 is disposed at a pitch of 100 μm, time measurement circuits up to the $128^{th}$ time measurement circuit 40 from the clock driver 35 are less likely to be influenced by the waveform collapse. Accordingly, even when an area of a detection surface is large, the photodetector device can appropriately detect occurrence of a pulse signal in each of the APDs 20 while securing time resolution. In a case where the clock driver 35 is provided in the circuit substrate 50, the wiring length from the clock driver 35 to the time measurement circuit 40 can be reduced.

When the frequency of the global clock signal is reduced, power consumption can be suppressed, and the amount of heat generated from the clock driver 35 can also be reduced. Since the clock driver 35 is provided in the circuit substrate 50 different from the APD array substrate 10, a distance between the clock driver 35 and each of the APDs 20 is longer in comparison to a case where the clock driver 35 is formed in the same substrate as in the APD 20. Since the clock driver 35 is provided in the circuit substrate 50, a clock driver 35 forming density is reduced. Accordingly, heat generated from the clock driver 35 is less likely to be transferred to the APD 20. As a result, erroneous measurement of measurement time can be suppressed.

Each of the time measurement circuits 40 includes the coarse counter unit 45 that counts the global clock signal. The time measurement circuit 40 may acquire, from an operation result of the coarse counter unit 45 and an operation result of the delay line 47, time information indicating timing at which the pulse signal is input from the corresponding APD 20. According to this, measurement of time longer than time capable of being measured by only the delay line is realized.

The coarse counter unit 45 initiates an operation in response to stoppage of the operation of the delay line 47, and stops the operation in synchronization with the global clock signal from the clock driver 35. In this case, when the pulse signal is not input from the corresponding APD 20, the delay line 47 does not operate, and the coarse counter unit 45 does not operate. According to this, power consumption can be reduced.

When viewed from a thickness direction of the APD array substrate 10, the plurality of time measurement circuits 40 are two-dimensionally arranged in the mounting region α that overlaps the photodetection region β in which the plurality of APD 20 are two-dimensionally arranged, and the clock driver 35 is disposed in the non-mounting region γ that does not overlap the photodetection region β. In this case, an influence of heat generated in the clock driver 35 on each of the APDs 20 can be further reduced.

The quenching circuit connected to the APD 20 is the active quenching circuit 41 and is formed in the circuit substrate 50. In a case where the semiconductor substrate 11 is formed from compound semiconductor, there is a concern that a lot of dark counts and after pulses may occur in comparison to a case where the semiconductor substrate 11 is formed from silicon. Since the active quenching circuit 41 is formed in the circuit substrate 50, the quenching time is easily realized in an arbitrary manner, and a noise due to the dark counts and the after pulses is likely to be reduced.

The APD array substrate 10 and the circuit substrate 50 are connected by the bump electrode 70. In this case, an influence of heat generated in the clock driver 35 on each of the APDs 20 can be further reduced in comparison to a case where the APD array substrate 10 and the circuit substrate 50 are connected by direct bonding or the like.

The circuit substrate 50 may include the silicon substrate 51. In this case, a manufacturing process of a configuration including the time measurement circuit 40 and the clock driver 35 can be simplified.

Hereinbefore, description has been given of the embodiment of the invention, but the invention is not limited to the above-described embodiment, and various modifications can be made in a range not departing from the gist.

In this embodiment, the coarse counter unit 45 counts the number of risings of the global clock signal until the stop signal is input after the operation of the delay line 47 of the fine unit 44 is stopped. However, the coarse counter unit 45 may count the number of risings of the global clock signal until the operation of the delay line 47 is stopped after a reset signal is input to the control circuit 42. In other words, the coarse counter unit 45 may count the number of risings of the global clock signal from the timing t1 to the timing t3 in FIG. 8. In this case, a time interval until the rising of the global clock signal is input after the pulse signal is input from the APD 20 is subtracted from an operation result of the coarse counter unit 45 on the basis of the count. According to this, it is possible to compute a time interval until the pulse signal is input from the APD 20 after the reset signal is input. That is, the time interval until the pulse signal is input from the APD 20 after the reset signal is input can be computed by subtracting the operation result in the fine unit 44 from the operation result of the coarse counter unit 45. In this case, each of the time measurement circuits 40 acquires time information indicating timing at which the pulse signal is input from the APD 20 with respect to the reset signal.

The time measurement circuit 40 may not include the coarse counter unit 45. In this case, the fine unit 44 detects a time interval until the stop signal is input after the pulse signal is input from the APD 20. That is, even in this case, each of the time measurement circuit 40 acquires time information indicating timing at which the pulse signal is input from the APD 20 with respect to the stop signal. In this case, a configuration of the time measurement circuit can be simplified.

In this embodiment the time measurement circuit 40 operates on the basis of rising of each pulse signal, but may operate on the basis of the falling.

REFERENCE SIGNS LIST

1: photodetector device, 10: APD array substrate, 20: APD, 35: clock driver, 40: time measurement circuit, 44: fine unit, 45: coarse counter unit, 50: circuit substrate, 70: bump electrode, α: mounting region, β: photodetection region, γ: non-mounting region.

The invention claimed is:
1. A photodetector device, comprising:
an avalanche photodiode array substrate in which a plurality of avalanche photodiodes are two-dimensionally arranged, the avalanche photodiode array substrate being formed from compound semiconductor, the plurality of avalanche photodiodes being connected to a quenching circuit and arranged to operate in a Geiger mode; and
a circuit substrate on which the avalanche photodiode array substrate is mounted,
wherein the circuit substrate includes a plurality of time measurement circuits two-dimensionally arranged in the circuit substrate in correspondence with the plurality of avalanche photodiodes, and a clock driver arranged to supply a clock signal to the plurality of time measurement circuits,
each of the time measurement circuits includes a delay line unit including a delay line constituted by a plurality of delay elements connected in series, and is arranged to acquire, from an operation result to the delay line, time information indicating timing at which a pulse signal is input from a corresponding one of the avalanche photodiodes to a corresponding one of the time measurement circuits,
the delay line unit is arranged to initiate an operation of the delay line in response to input of the pulse signal output from the corresponding avalanche photodiode to the time measurement circuit, and to stop the operation of the delay line in response to input of the clock signal from the clock driver to the time measurement circuit, and is arranged to detect a time interval shorter than a cycle of the clock signal by the operation of the delay line,
wherein each of the time measurement circuits further includes a counter arranged to count the clock signal, and is arranged to acquire, from an operation result of the counter and an operation result of the delay line, time information indicating timing at which the pulse signal is input from the corresponding avalanche photodiode,
wherein the counter is arranged to initiate an operation of the counter in response to stoppage of the operation of the delay line, and to stop the operation of the counter in synchronization with the clock signal from the clock driver,
wherein the circuit substrate includes a memory and a control circuit arranged to control the time measurement circuit for every time measurement circuit,
the control circuit is arranged to reset the corresponding time measurement circuit in response to input of a reset signal to the control circuit, and to stop input of the clock signal to the counter in response to input of a stop signal to the control circuit,
the reset signal and the stop signal are synchronized with the clock signal,
the delay line unit is arranged to store, in the memory, the number of the delay elements which have operated from input of the pulse signal until an input of the clock signal from the clock driver to the time measurement circuit when the pulse signal is output from the corresponding avalanche photodiode after the reset signal is input to the corresponding time measurement circuit, and the counter is arranged to store, in the memory, the number of the clock signal counted from stoppage of the operation of the delay line until input of the stop signal to the counter.

2. The photodetector device according to claim 1, wherein, when viewed from a thickness direction of the avalanche photodiode array substrate,
the plurality of time measurement circuits are two-dimensionally arranged in a region that overlaps a photodetection region in which the plurality of avalanche photodiodes are two-dimensionally arranged, and
the clock driver is disposed in a region that does not overlap the photodetection region.

3. The photodetector device according to claim 1, wherein the quenching circuit is an active quenching circuit, and is formed in the circuit substrate.

4. The photodetector device according to claim 1, wherein the avalanche photodiode array substrate and the circuit substrate are connected by a bump electrode.

5. The photodetector device according to claim 1, wherein the circuit substrate includes a silicon substrate.

\* \* \* \* \*